United States Patent
Shenoy et al.

(10) Patent No.: US 9,263,370 B2
(45) Date of Patent: Feb. 16, 2016

(54) SEMICONDUCTOR DEVICE WITH VIA BAR

(71) Applicant: QUALCOMM Incorporated, San Diego, CA (US)

(72) Inventors: Ravindra Vaman Shenoy, Dublin, CA (US); Kwan-yu Lai, Campbell, CA (US); Jon Bradley Lasiter, Stockton, CA (US); Philip Jason Stephanou, Mountain View, CA (US); Donald William Kidwell, Jr., Campbell, CA (US); Evgeni Gousev, Saratoga, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 151 days.

(21) Appl. No.: 14/040,223

(22) Filed: Sep. 27, 2013

(65) Prior Publication Data

US 2015/0091179 A1  Apr. 2, 2015

(51) Int. Cl.
*H01L 23/48* (2006.01)
*H01L 23/52* (2006.01)
(Continued)

(52) U.S. Cl.
CPC ............ *H01L 23/481* (2013.01); *H01L 21/486* (2013.01); *H01L 23/15* (2013.01);
(Continued)

(58) Field of Classification Search
CPC ............... H01L 2224/48227; H01L 2924/00; H01L 2224/32225; H01L 2224/73204; H01L 2924/15311; H01L 2924/014; H01L 21/76898; H01L 2224/05541; H01L 2224/73253; H01L 21/76877; H01L 2224/16145; H01L 24/05; H01L 2224/81815; H01L 2224/16227; H01L 23/5389; H01L 2224/1308; H01L 2225/06517; H01L 21/486; H01L 2224/04073; H01L 2225/1058; H01L 25/0652; H01L 23/49822; H01L 24/02; H01L 21/8221; H01L 2224/16; H01L 2224/83894; H01L 23/5386; H01L 27/0207; H01L 27/0688; H01L 27/11; H01L 27/112; H01L 27/11206; H01L 21/4857; H01L 2223/6616; H01L 2224/02333; H01L 2224/04105; H01L 2224/05009; H01L 2224/06181; H01L 23/5226; H01L 23/5384; H01L 24/10
USPC ........... 257/774, E21.499, E23.011, E23.141, 257/686, E21.506, E21.614, E23.067, 257/E25.006, E25.013, E25.018, 737, 888, 257/685, 723, 724; 438/106, 667, 455, 458, 438/622, 652
See application file for complete search history.

(56) References Cited

U.S. PATENT DOCUMENTS 5,331,200 A * 7/1994 Teo .................. H01L 23/49551
257/666
5,790,384 A   8/1998 Ahmad et al.
(Continued)

FOREIGN PATENT DOCUMENTS

WO   WO9919911 A1   4/1999

OTHER PUBLICATIONS

International Search Report and Written Opinion—PCT/US2014/053458—ISA/EPO—Feb. 12, 2015.
(Continued)

*Primary Examiner* — Dao H Nguyen
*Assistant Examiner* — Tram H Nguyen
(74) *Attorney, Agent, or Firm* — Weaver Austin Villeneuve & Sampson, LLP

(57) ABSTRACT

A semiconductor device comprising a second surface of a logic die and a second surface of a via bar coupled to a first surface of a substrate, a second surface of a memory die coupled to a first surface of the via bar, a portion of the second surface of the memory die extending over the first surface of the logic die, such that the logic die and the memory die are vertically staggered, and the memory die electrically coupled to the logic die through the via bar. The via bar can be formed from glass, and include through-glass vias (TGVs) and embedded passives such as resistors, capacitors, and inductors. The semiconductor device can be formed as a single package or a package-on-package structure with the via bar and the memory die encapsulated in a package and the substrate and logic die in another package.

26 Claims, 13 Drawing Sheets

(51) Int. Cl.
*H01L 29/40* (2006.01)
*H01L 25/065* (2006.01)
*H01L 27/108* (2006.01)
*H01L 23/15* (2006.01)
*H01L 23/498* (2006.01)
*H01L 25/10* (2006.01)
*H01L 25/18* (2006.01)
*H01L 23/50* (2006.01)
*H01L 21/48* (2006.01)
*H01L 23/538* (2006.01)

(52) U.S. Cl.
CPC .......... *H01L23/49827* (2013.01); *H01L 23/50* (2013.01); *H01L 23/5381* (2013.01); *H01L 25/0657* (2013.01); *H01L 25/105* (2013.01); *H01L 25/18* (2013.01); *H01L 27/108* (2013.01); *H01L 2224/16225* (2013.01); *H01L 2224/48091* (2013.01); *H01L 2224/48465* (2013.01); *H01L 2224/48471* (2013.01); *H01L 2225/06517* (2013.01); *H01L 2225/06527* (2013.01); *H01L 2225/06548* (2013.01); *H01L 2225/06562* (2013.01); *H01L 2225/06572* (2013.01); *H01L 2924/15311* (2013.01); *H01L 2924/19105* (2013.01)

(56) References Cited

U.S. PATENT DOCUMENTS

| | | | |
|---|---|---|---|
| 6,384,485 B1 * | 5/2002 | Matsushima | 257/778 |
| 8,263,439 B2 | 9/2012 | Marimuthu et al. | |
| 2003/0085058 A1 * | 5/2003 | Komatsu | H05K 3/4069 174/264 |
| 2007/0257761 A1 * | 11/2007 | Mano | H01F 17/0006 336/200 |
| 2008/0150157 A1 | 6/2008 | Nishimura et al. | |
| 2010/0181458 A1 * | 7/2010 | Liu | F16B 47/00 248/363 |
| 2010/0314740 A1 * | 12/2010 | Choi | H01L 23/3121 257/686 |
| 2011/0291261 A1 * | 12/2011 | Fleischman et al. | 257/737 |
| 2011/0291288 A1 | 12/2011 | Wu et al. | |
| 2012/0001339 A1 | 1/2012 | Malatkar | |
| 2012/0106117 A1 * | 5/2012 | Sundaram et al. | 361/808 |
| 2013/0161812 A1 | 6/2013 | Kim et al. | |
| 2013/0228918 A1 * | 9/2013 | Chen | H01L 23/49811 257/737 |
| 2013/0242493 A1 | 9/2013 | Shenoy et al. | |
| 2013/0323885 A1 * | 12/2013 | Chun | H01L 21/56 481/123 |
| 2014/0181458 A1 * | 6/2014 | Loh et al. | 711/206 |
| 2014/0252632 A1 * | 9/2014 | Barth | H01L 23/5384 257/773 |
| 2014/0346668 A1 * | 11/2014 | Mitsuhashi | 257/737 |

OTHER PUBLICATIONS

Partial International Search Report—PCT/US2014/053458—ISA/EPO, Nov. 6, 2014.

* cited by examiner

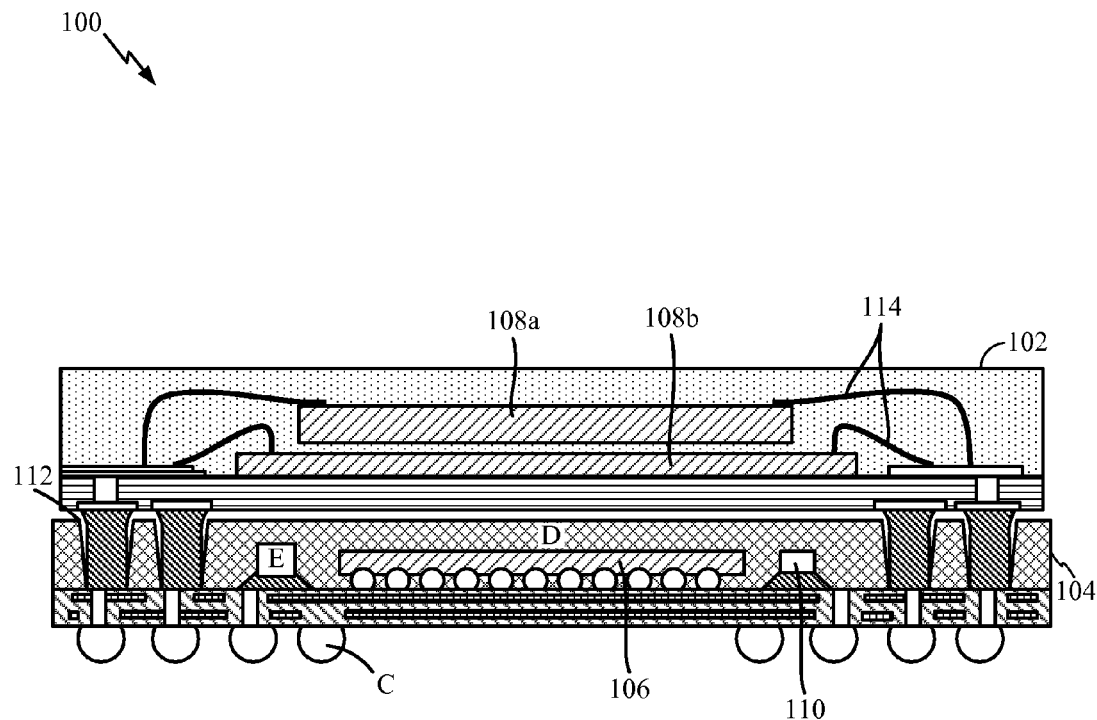
CONVENTIONAL
FIG. 1

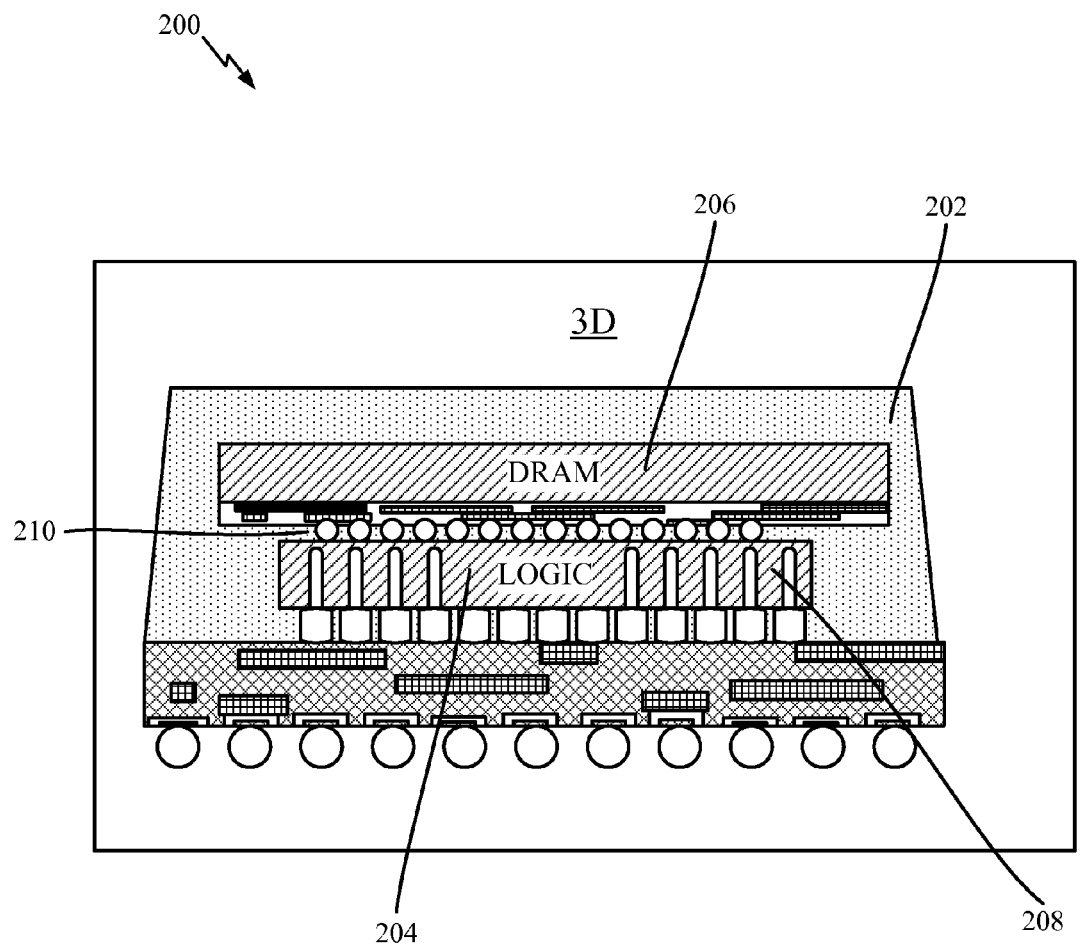
CONVENTIONAL
FIG. 2

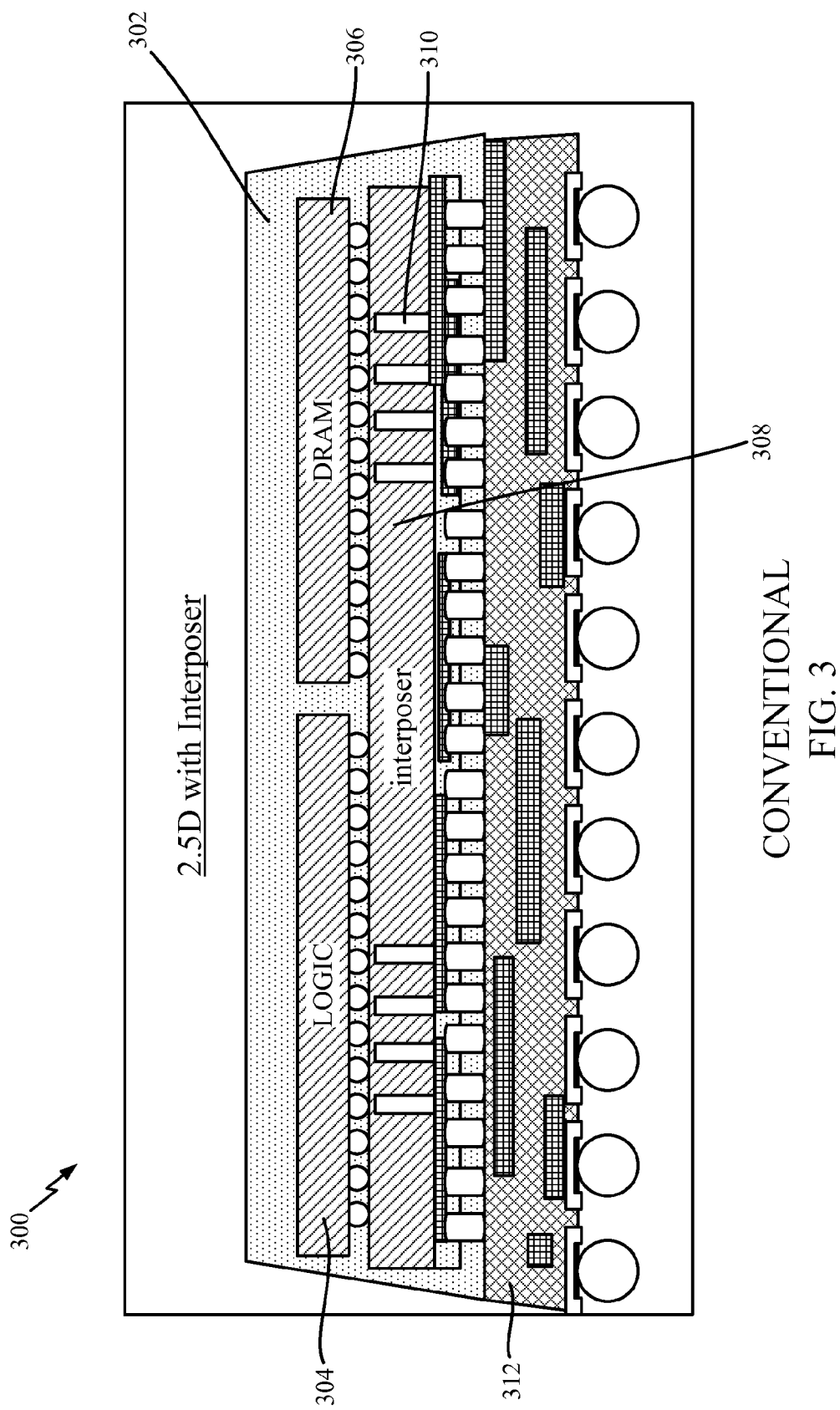
CONVENTIONAL
FIG. 3

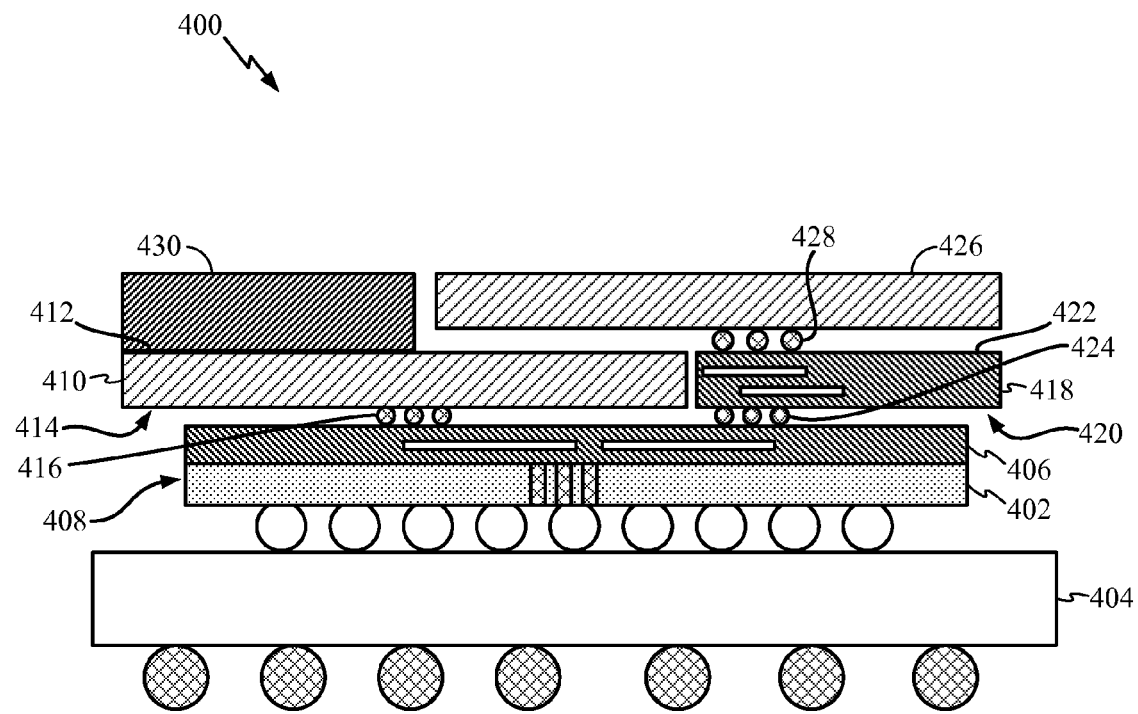
CONVENTIONAL
FIG. 4

SEMICONDUCTOR DEVICE WITH VIA BAR

FIELD OF THE DISCLOSURE

Disclosed embodiments are directed to via bars for semiconductor devices. More particularly, exemplary embodiments relate to single or multiple package semiconductor devices, which include a glass via bar, and optionally, a glass interposer, for coupling a semiconductor die with one or more memory dies.

BACKGROUND OF THE INVENTION

Recent trends in semiconductor device applications, especially mobile device applications, include a push towards higher performance levels while maintaining low power consumption, cost, and area. In order to achieve these goals, vendors and semiconductor device manufacturers are exploring solutions for increasing memory capacity of the devices, reducing package size, improving testability, and integrating passive components efficiently in device packages. The state of the art related to device packages will be discussed briefly with a few examples to illustrate benefits as well as weaknesses in known solutions.

Firstly, with regard to FIG. 1, a multiple package solution will be discussed. FIG. 1 illustrates a conventional package-on-package (PoP) 100. PoP 100 includes at least the two illustrated packages 102 and 104 attached to each other. Package 104 includes logic die 106, and package 102 includes one or more memory dies, such as memory dies 108a and 108b. Accordingly, logic die 106 and memory dies 108a-108b may be packaged separately and the packages attached to each other. Wire bonds 114 and/or through mold vias (TMVs) 112 are also typically used for electrically connecting logic die 106 and memory dies 108a-b.

In the illustrated configuration, PoP 100 has several attractive features. In general it allows for close proximity and control of relative placement of logic die 106 and memory dies 108a-b. Testability of individual dies is also improved because the logic and memory dies can be separately tested, and only dies which pass the tests (also known as "known good dies") are packaged. This keeps costs low and allows the ability to customize memory needs for particular processors. Moreover, there is improved flexibility in the sourcing of memory dies 108a-b. For example, memory dies 108a-b may comprise dynamic random access memory (DRAM). DRAM dies of different sizes and/or from different vendors/manufacturers can be easily integrated into package 102, to suit particular needs of a processor integrated on logic die 106, for example.

However, PoP 100 suffers from several drawbacks. Typically, PoP structures such as PoP 100 include vertical stacking of the packages comprising logic and memory dies. This leads to an undesirable increase in the total height of PoP 100. Further, wire bonds 114 create long paths between logic die 106 and memory dies 108a-b. The pitch of TMVs 112 tends to be high because of the thickness of the packages/molds that need to be traversed to interconnect logic die 106 and memory dies 108a-b. Moreover, passives, such as the illustrated capacitor 110 are not integrated efficiently in typical PoP structures, and this leads to an increased footprint (horizontal area). Narrow input/output (I/O) interfaces, or rather, a lack of support for wide I/O interfaces, are seen as yet another limitation of PoP 100.

Rather than package the logic and memory dies separately as in PoP 100, single package solutions are also known in the art, and will be described with regard to FIGS. 2-3. In FIG. 2, a so called "3D package" structure 200 is illustrated. 3D package 200 comprises a unified package 202 that encapsulates logic die 204, as well as, DRAM die 206. Logic die 204 and DRAM die 206 are vertically integrated. One improvement of 3D package 200 over PoP 100 is that the lengths of interconnections 208, for example, between logic die 204 and DRAM die 206 are significantly reduced, as these do not have to traverse package molds. Additionally, 3D package 200 can support very wide I/O interfaces, which enables high bandwidth memory access.

However, 3D package 200 also suffers from several drawbacks. The unified package structure leads to loss of flexibility in sourcing the DRAM die, at least prior to I/O standardization. Once again, package height, although lower than PoP 100, is still high in 3D package 200 due to the vertical integration of logic die 200 and DRAM die 206. Thermal management is a problem, because it is difficult to contain the heat propagation from logic die 204 to DRAM die 206. Moreover, redistribution layer (RDL) 210 is typically needed to enable integration of DRAM die 206 with logic die 204. RDL 210 tends to be expensive and leads to increase in cost of 3D package 200.

FIG. 3 illustrates another single package solution, referred to herein, as a "2.5D package." More specifically, FIG. 3 illustrates 2.5D package with interposer 300, which includes package 302. Package 302 also encapsulates logic die 304 and DRAM die 302 in a single package or mold. Rather than vertically stacking logic die 204 and the DRAM die 206 as in 3D package 200 above, package 302 involves a side-by-side placement of logic die 304 and DRAM die 306. The logic and memory dies are connected by an interposer structure through which electrical connections can be formed. As shown, package 302 includes interposer 308 formed on substrate 312. Interposer 308 is typically formed from silicon, and includes through silicon vias (TSVs) 310 for connecting the two dies. Such an interposer configuration is seen to keep the length of interconnections low, while also supporting wide I/O interfaces for high bandwidth memory access. Interposer 308 also provides additional structural support for logic die 304 and DRAM die 306. Significantly, the height of package 302 is low due to the horizontal side-by-side placement of logic die 304 and DRAM die 306, rather than vertically stacking them as in 3D package 200 and PoP 100 above. This also improves thermal management because heat does not directly propagate from logic die 304 to DRAM die 306.

However, 2.5D package with interposer 300 also suffers from several deficiencies. The cost of the typical interposer is high, and TSV technology is expensive. Moreover, this structure reduces package height at the cost of a large package footprint.

With reference to FIG. 4, package 400 according to Applicant's co-pending and commonly owned U.S. patent application Ser. No. 13/766,218, entitled "semiconductor device having stacked memory elements and method of stacking memory elements on a semiconductor device," is illustrated. Package 400 overcomes several of the drawbacks of packages 100-300 of FIGS. 1-3 discussed above, and provides a stacking arrangement with improved mechanical stability and thermal management, while reducing the footprint of the package. In relevant aspects, FIG. 4 illustrates package 400 comprising logic die 402 mounted on package substrate 404 which includes redistribution layer (RDL) 406. A first memory device, DRAM 410 is coupled to RDL 406 by microbumps 416 at a first location on the redistribution layer 406 so that logic die 402 can communicate with the first memory device 410. An interposer formed of Silicon, interposer 418 is mounted on RDL 406, adjacent to DRAM 410.

Microbumps 424 on interposer 418 provide an electrical connection between interposer 418 and a second location on RDL 406. Interposer 418 also includes through-vias (not illustrated), such as, TSVs, to connect locations on top surface 422 of interposer 418 to microbumps 424 and provide an electrical pathway through interposer 418. This configuration of logic die 402, interposer 418, and DRAM 410 provides mechanical stability to the stacking arrangement, while reducing the footprint, as compared to 2.5D package with interposer 300, for example.

Moreover, a second memory device, DRAM 426 can be mounted on and coupled to interposer 418 with microbumps 428, to provide an electrical connection between DRAM 426 and interposer 418. Beneficially, this arrangement also reduces the length of electrical connections between DRAM 426 and logic die 402, as compared to coplanar mounting arrangements or PoP 100, for example. Spacer 430, which may be thermally conductive, may be mounted on a remaining portion of top surface 412 of DRAM 410. Spacer 430 may be formed of silicon or other material having comparable thermal and mechanical properties and may enhance mechanical integrity by equalizing mechanical stresses in a molded package including the first and second memory devices and also enhance heat transfer. Thus, package 400 may also provide an improved solution for thermal management as compared to 3D package 200, for example.

However, in some aspects, silicon interposer 418 also involves the use of expensive TSVs. The TSV technology can impose restrictions on pitch, and may, for example, limit thickness of interposer 418 to 100 um. In order to retain mechanical stability and prevent excessive overhang of the memory devices (e.g. DRAM 410) and interposer 418 over the so called "tier 1" die, which includes logic die 402 and RDL 406, restrictions are placed on the size of interposer 418. In other words, the size of interposer 418 is dependent on, or limited by, the size of logic die 402, which can, in turn, impose restrictions on TSV placement and design of interconnections through interposer 418. Moreover, package 400 is configured for a single package solution, and does not offer the flexible design choices which are possible in a PoP solution. Testing may be performed at the final package level. Wafer level testing to determine known good dies is possible, but fine pitch TSV testing cannot be performed.

Accordingly, there is a need for semiconductor device package structures which overcome the aforementioned drawbacks, while also providing desirable features, such as, low package height, small footprint, flexibility in DRAM sourcing, minimization or elimination of an RDL layer, low cost interposers, etc.

SUMMARY

Disclosed embodiments are directed to systems and methods for forming glass via bar structures.

More particularly, an exemplary embodiment is directed to a semiconductor device comprising: a second surface of a logic die and a second surface of a first via bar coupled to a first surface of a substrate, a second surface of a first memory die coupled to a first surface of the first via bar, a portion of the second surface of the first memory die extending over the first surface of the logic die, such that the logic die and the first memory die are vertically staggered, and where the first memory die is electrically coupled to the logic die through the first via bar.

Another exemplary embodiment is directed to a method of forming a semiconductor device, the method comprising: forming a logic die and a first via bar on a first surface of a substrate, such that a second surface of the logic die and a second surface of the first via bar are coupled to a first surface of the substrate, coupling a first memory die to a first surface of the first via bar, a portion of the second surface of the first memory die extending over the first surface of the logic die, such that the logic die and the first memory die are vertically staggered, and electrically coupling the first memory die to the logic die through the first via bar.

Yet another exemplary embodiment is directed to a semiconductor device comprising: a coupling means, a second surface of a logic die and a second surface of the coupling means formed on a first surface of a substrate, a second surface of a first memory die coupled to a first surface of the coupling means, a portion of the second surface of the first memory die extending over the first surface of the logic die, such that the logic die and the first memory die are vertically staggered, and the first memory die electrically coupled to the logic die through the coupling means.

Another exemplary embodiment is directed to a non-transitory computer-readable storage medium comprising instructions that, when executed by a computer, cause the computer to form a logic die and a first via bar on a first surface of a substrate, such that a second surface of the logic die and a second surface of the first via bar are coupled to a first surface of the substrate, couple a first memory die to a first surface of the first via bar, a portion of the second surface of the first memory die extending over the first surface of the logic die, such that the logic die and the first memory die are vertically staggered, and electrically couple the first memory die to the logic die through the first via bar.

BRIEF DESCRIPTION OF THE DRAWINGS

The accompanying drawings are presented to aid in the description of embodiments of the invention and are provided solely for illustration of the embodiments and not limitation thereof.

FIG. 1 illustrates a conventional PoP structure comprising a logic package and a memory package with one or more memory dies.

FIG. 2 illustrates a conventional single package 3D stacking of logic and memory dies.

FIG. 3 illustrates a conventional 2.5D package with interposer.

FIG. 4 illustrates a stacked arrangement of logic and memory dies with an interposer and spacer according to co-pending U.S. patent application Ser. No. 13/766,218.

DETAILED DESCRIPTION

Figure 5A:
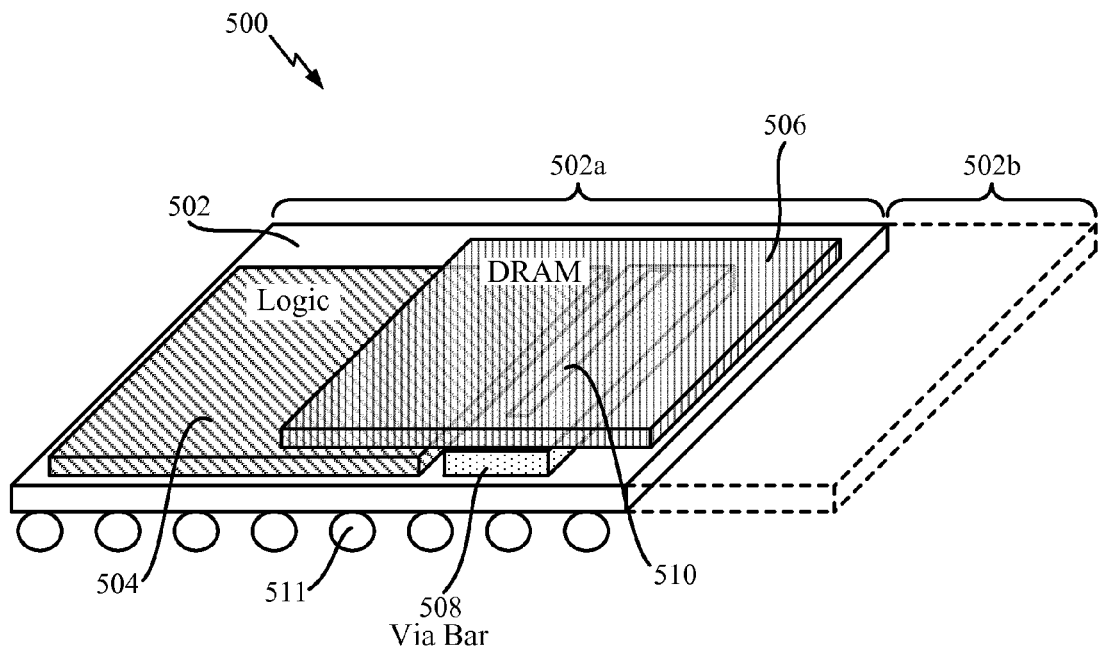
FIGS. 5A-C illustrate schematic representations of exemplary packaging structures with a logic die and a single memory die in single package and PoP structures.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects are directed to package structures for semiconductor devices, comprising a "via bar." A via bar can be formed using glass, and can be configured to provide interconnections using through-glass vias (TGVs) in some examples. Unlike traditional interposer structures discussed above, an exemplary via bar is small in size and can support flexible design options for placement, and also support wide I/O interfaces for high bandwidth memory access. In some aspects, the via bar can include embedded passive components.

Fabrication of glass via bars for PoP structures, wherein the via bars can include high density TGV arrays and passive components embedded and/or formed on a surface of the via bars is described in detail in Applicant's co-pending US Patent Application, entitled "Incorporation Of Passives and Fine Pitch Through Via For Package On Package," (Ser. No. 13/748/294, hereafter referred to as "the 123236 Application"). In relevant aspects, via bars in exemplary embodiments can provide the ability to scale the via pitch from 500 microns to 50 microns and the via diameter from 200 microns to 30 microns, where glass via bars are fabricated for thickness of 30 um to 500 um. Advantages of scaling the pitch and diameter include fabricating smaller packages and increasing capacity and flexibility in package design. Passive components, such as, capacitors, resistors, inductors, etc., can be co-fabricated with and incorporated into the glass via bar. Advantages of incorporating passive components into the glass via bar include the ability to place the passive components closer to semiconductor dies in a package, improving power delivery or power distribution to the semiconductor die or logic die, reducing the electrical path length, increasing performance, reducing the number of components, simplifying assembly, and reducing cost. The glass via bar can be formed from borosilicate glass, aluminosilicate glass, soda lime glass, quartz, Pyrex, or other suitable glass material. In some implementations, the glass substrate is a borosilicate glass substrate that can be ablated by laser radiation. In some implementations, the glass substrate is a photo-patternable glass substrate. TGVs can extend through the glass via bar, providing conductive pathways between opposing faces or surfaces. Conductive routing or routing lines can be provided on one or more faces or surfaces of the via bars.

In some aspects, exemplary via bars, along with optional passives, can also be part of an embedded wafer level package (eWLP), for example, as described in detail, along with formation of configurable glass via bars, in Applicant's co-pending U.S. patent application Ser. No. 13/566,925, entitled "Passives Via Bar," (hereinafter referred to as "the '925 Application"). Accordingly, exemplary implementations pertaining to eWLP can include glass via bars with through-glass vias which can provide inter-level connections in stacked 3D packages, for example. eWLP leverages wafer level processing to package singulated dies, such as semiconductor dies. For example, dies, such as, semiconductor dies, can be placed on a carrier substrate, and a curable compound can be used to fill gaps between the dies and the edges around the dies. After curing, the cured compound will form a mold frame, or molding, around the dies. The dies and the molding will form an artificial wafer, also referred to as a reconfigured wafer, which can then undergo wafer level processing including addition of one or more redistribution layers (RDLs) and solder balls, followed by package singulation. In some cases, the above-described eWLP may be referred to as embedded or extended wafer level package, embedded or extended wafer level package ball grid array (eWLB), fan out wafer level chip scale package (fan out WLCSP), wafer level fan out package (fan out WLP), extended wafer level packaging, or advanced wafer level package (aWLP).

In some aspects, one or more via bars, which may be formed according to above-described PoP or eWLP configurations, can be used for connecting a logic die to one or more memory dies, wherein, a single via bar can support multiple memory die connections and stacked memory die configurations. Accordingly, exemplary embodiments can include one or more structures pertaining to single package, eWLP, or PoP configurations, without departing from the scope of this disclosure. In general, embodiments offer a balance between footprint and package height, such that both low package heights and low footprints are achievable. Additional features in embodiments include solder balls, Cu pillars, or plated Cu via structures for inter-level interconnects, integration of passive components on the surface of the via bar, support for variable attachment of via bars on either side of a semiconductor substrate, compatibility with flip chip configurations, etc.

Figure 5B:
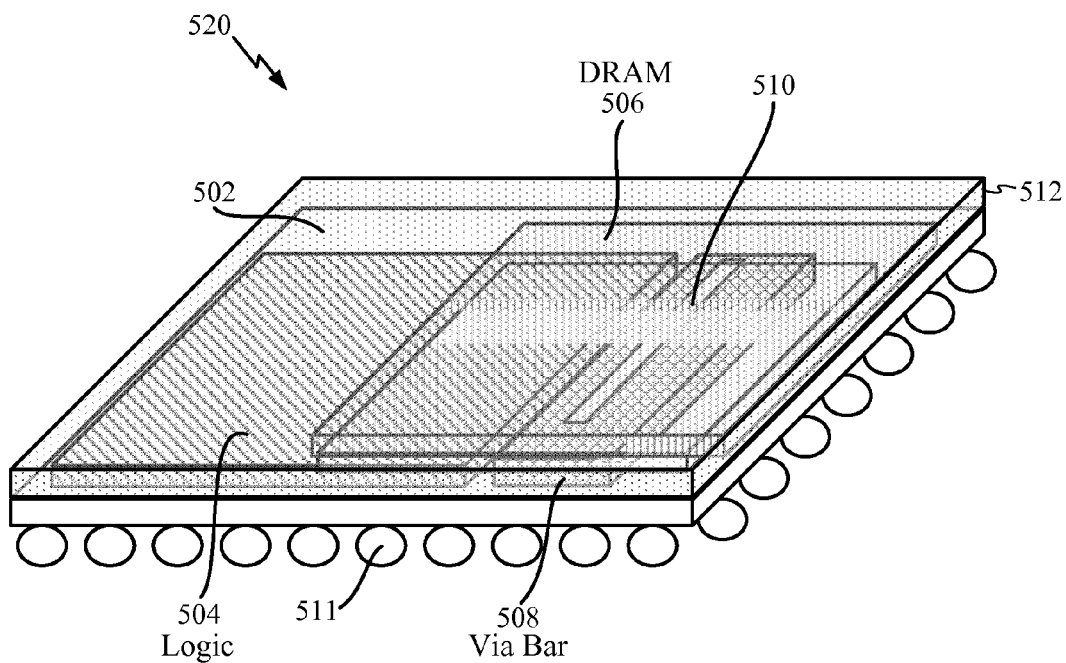
Figure 5C:
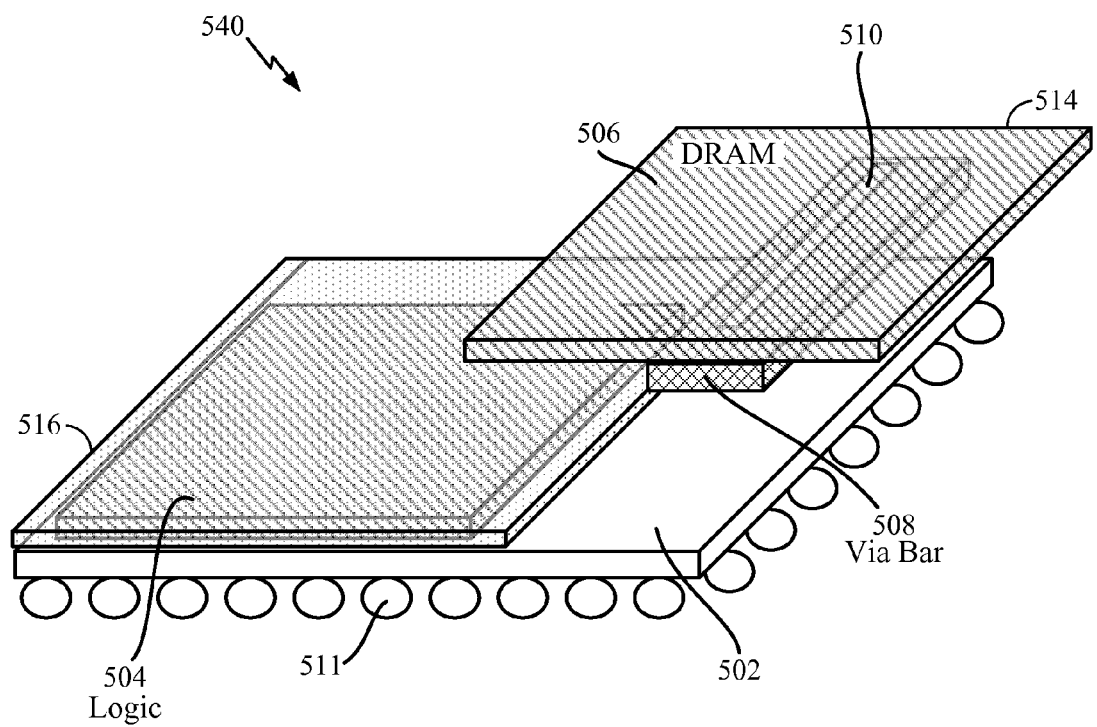

With reference to FIGS. 5A-C, schematic three-dimensional views for preliminary aspects of packaging structures according to exemplary embodiments are illustrated. In FIG. 5A, structure 500 according to an exemplary embodiment, is illustrated. Structure 500 can be further mounted on an electronic device printed circuit board (PCB), not shown, via inter-level interconnects, such as solder balls 511. An example of such an electronic device PCB is a PCB for a handheld device, such as a mobile phone. Structure 500 comprises substrate 502. Inter-level interconnects or solder balls 511 may be attached on a second surface or bottom surface of substrate 502. Substrate 502, which may be variably sized. For example, substrate 502 may span the region depicted by 502a in order to accommodate logic die 504 and a first via bar, such as, via bar 508, or it may extend to region 502b and beyond, in order to accommodate other components not illustrated. In some aspects, substrate 502 can be formed of glass. The glass substrate may be or include, for example, a borosilicate glass, a soda lime glass, quartz, Pyrex, or other suitable glass material. In some implementations, the glass substrate is a borosilicate glass substrate that can be ablated by laser radiation. In some implementations, the glass substrate can have a coefficient of thermal expansion (CTE) matched to the CTE of another component of a package, or between the CTEs of two or more components of a package. For example, a glass substrate can have a relatively low CTE of about 3.4 ppm/° C. matched to silicon, a relatively high CTE of about 10 ppm/° C. matched to a PCB or mold compound, or a CTE between these components. In some implementations, the glass substrate is a photo-patternable glass substrate. TGV holes and surface etching for metal routing is efficiently accomplished in exemplary photo-patternable glass substrates.

Logic die 504 and via bar 508 are attached to a first surface, such as, a top surface of substrate 502, such that logic die 504 and via bar 508 are side-by-side or on a same plane. Logic die 504 can include a semiconductor device with various integrated circuit components, related, for example, to a general purpose single- or multi-chip processor, a digital signal processor (DSP), an application specific integrated circuit (ASIC), a field programmable gate array (FPGA) or other programmable logic device, discrete gate or transistor logic, discrete hardware components. While a single logic die 504 is depicted and described, it will be understood that similar notions can be easily extended to two or more logic dies with respective additional via bar arrangements around the logic dies. Accordingly, for the sake of simplicity, the disclosure will primarily focus on single logic die structures, while it will be appreciated that multiple logic die structures are within the scope of exemplary embodiments.

Figure 7A:
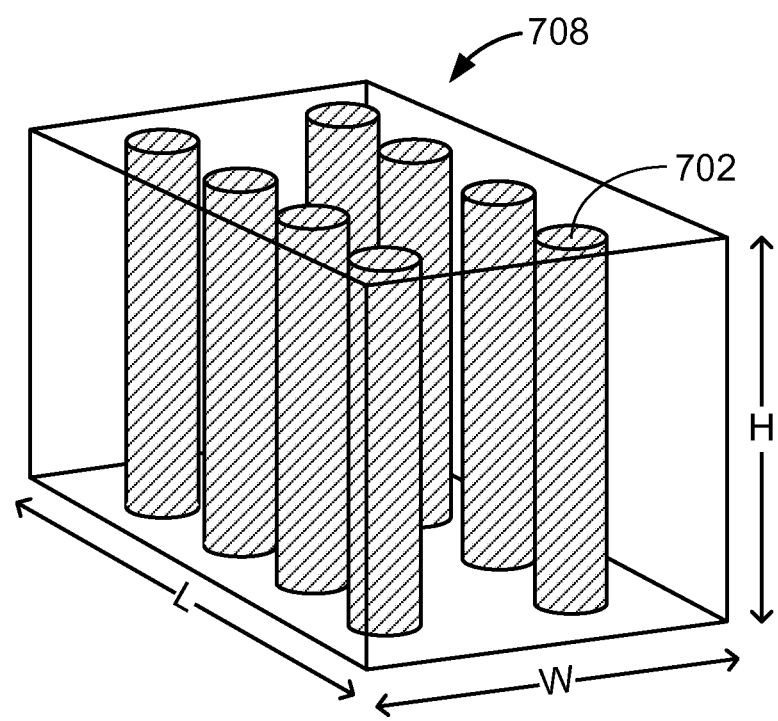
FIGS. 7A-B illustrate exemplary glass via bar structures with through-glass vias, embedded passives, and surface routing structures.
Figure 7B:
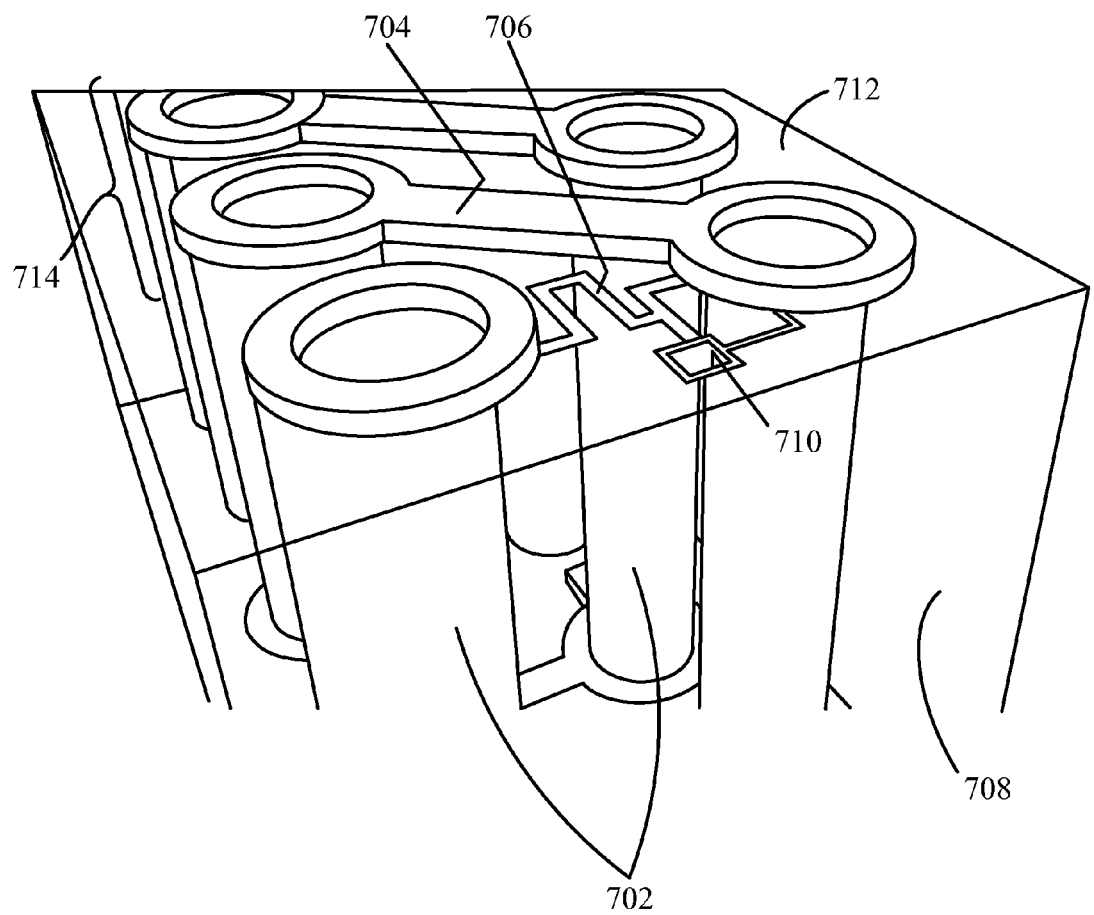

In exemplary embodiments, via bar 508 is designed to be smaller in size than conventional interposers, for example. Via bar 508 can be made from glass, and interconnects can be formed through an exemplary glass via bar using TGVs. A memory device can be coupled to logic die 504 through via bar 508, by the use of the TGVs and routing structures on the surfaces of the via bars (exemplary TGVs and routing structures are illustrated in FIGS. 7A-B, and described in later sections). While any type of memory device can be connected as such, without restriction, embodiments will be described using a memory device comprising a DRAM. In other examples, memory devices can include various other known memory structures, such as, random access memory (RAM), static RAM (SRAM), phase-change RAM (PRAM), magnetic RAM (MRAM), FLASH, etc.

Accordingly, as illustrated, DRAM die 506 can be coupled to logic die 504 through via bar 508. The placement of DRAM die 506 is staggered in a vertical direction with respect to logic die 504, and conventional vertical integration, such as, 3D stacking of DRAM die 506 on top of logic die 504 is avoided. DRAM die 506 can have leads 510 in its center, or in other words, include a "lead on center" configuration, which enables wide I/O interfaces and easy connectivity to via bar 508. Leads 510 are formed on a second surface, such as, a bottom surface of DRAM die 506 and the second surface of DRAM die 506 is electrically coupled to a first surface, such as, a top surface of via bar 508. Electrical connections can extend through via bar 508 by means of TGVs to a second surface or bottom surface of via bar 508. Routing structures, such as, metal connections can originate from the second or bottom surface of via bar 508 and extend to logic die 504 through metal connections or routing structures on the first or top surface of substrate 502, thus electrically coupling logic die 504 and DRAM 506. A portion of the second surface of DRAM die 506 may extend over a first surface, such as, a top surface of logic die 504. Due to the vertically staggered arrangement of logic die 504 and DRAM 506, heat can dissipate from logic die 506 through the areas non-overlapping with DRAM die 506.

With reference to FIG. 5B, an implementation is illustrated where components of structure 520 are encapsulated in a single package 512. Structure 520 includes the components and related arrangements discussed with regard to structure 500 of FIG. 5A. A detailed description of common features between these two structures will not be repeated, for the sake of brevity. Briefly, package 512 is formed to encapsulate elements 502-511 discussed above. The footprint of package 512 is lower than a conventional side-by-side placement of logic and memory dies (e.g., as per 2.5D package with interposer 300 of FIG. 3). In some implementations, approximately 15% reduction in footprint can be achieved by package 512, as compared to conventional side-by-side placement of logic and memory dies. Moreover, the package height of package 512 is lower than a conventional vertical stacking of logic and memory dies (e.g., as per 3D package 200 or PoP 100) because there is no intervening RDL or package mold between the logic and memory dies in package 512. In some implementations, package height of package 512 can be reduced by approximately 600-800 um, in comparison to conventional PoP structures. Further, in some implementations, approximately 30% reduction in signal length between logic and memory dies is observed in package 512, in comparison to conventional package structures. These improvements also mean that package 512 would be cheaper and more power efficient than conventional package structures.

Referring to FIG. 5C, yet another implementation of an exemplary package structure 540 is illustrated in a PoP configuration. Once again, structure 540 comprises many of the same components described with reference to FIGS. 5A-B above, and a description of these common features will be avoided. Briefly, structure 540 comprises elements 502-511 above, but packaged differently. More specifically, structure 540 includes two packages, 514 and 516. In one example, logic die 504 and substrate 502 may be formed in package 516, while DRAM 506 and via bar 508 may be encapsulated in package 514. Package 514 is attached to package 516 in such a manner as to retain the vertically staggered configuration of the logic die and the memory die, as per structures 500 and 520 of FIGS. 5A-B. Thus, advantages of low footprint and improved thermal management are retained. The PoP configuration of structure 540 illustrated in FIG. 5C also has advantageous features such as, improved testability to determine known good dies. A known good DRAM die in package 514, can thus be determined prior to attachment to package 516 comprising logic die 504. Moreover, DRAM die 506 can be sourced with improved flexibility because of the PoP configuration of structure 540. Structure 540 is also mass reflow and bond-on-lead (BOL) process compatible. According to various implementations, reflow processes to attach a PoP to an electronic device PCB can involve a single or multiple reflow operations to attach the PoP in place on the electronic device PBC. If multiple reflow processes are used, in some implementations, a higher temperature solder can be used in the first reflow operation, followed by a reflow operation using a lower temperature solder. In some implementations, a solder that forms an intermetallic composition that does not melt during the second reflow operation can be used in the first reflow operation.

With reference now to FIGS. 6A-E, alternative embodiments with multiple memory dies are illustrated. While single logic dies are illustrated, it will be recognized that the multiple memory dies may be connected to one or more logic dies, wherein each logic die may support multiple processor cores for example. Such configurations may be suitable for processing needs that are commonly seen in laptops, personal computers, and servers, for example. These configurations may be formed as a single package (e.g., similar to structure 520 of FIG. 5B) or a PoP (e.g., similar to structure 540 of FIG. 5C, wherein, the logic die (or multiple logic dies in some cases) may be packaged in one package, while each of the multiple memory dies, along with respective via bars, may be packaged in other packages.

Figure 6A:
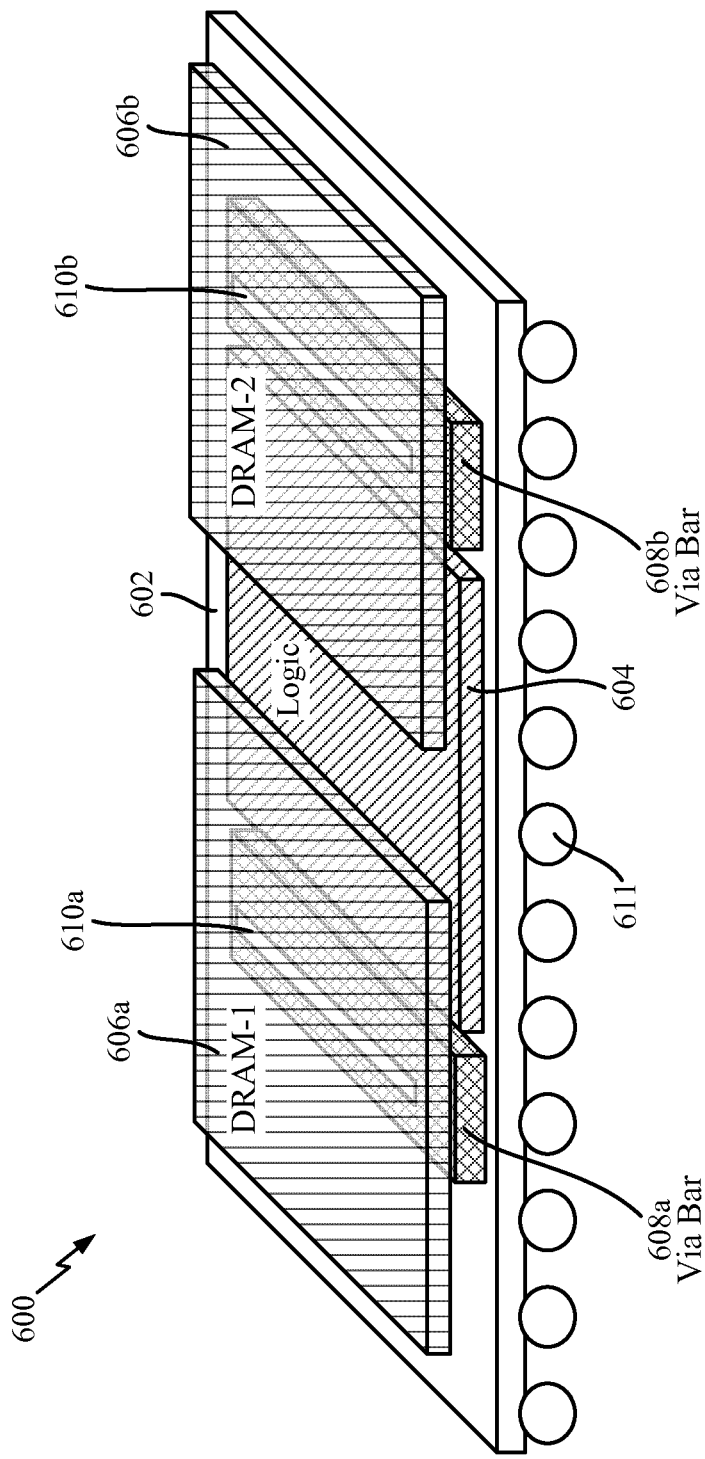
FIGS. 6A-E illustrate exemplary packaging structures with multiple memory dies.

With reference to FIG. 6A, structure 600 is illustrated, which includes two memory dies coupled to a logic die, according to exemplary embodiments. A detailed description of similar components in structure 600 which have been previously described will be omitted, with the assumption that like components will have similar structures and functions. Rather, focus will be provided on the variations involved in structure 600 over structures 500-520 above. Structure 600 comprises substrate 602 with inter-level interconnect such as solder balls 611 attached on a second surface, such as, a bottom surface of substrate 602. On a first surface, such as, a top surface of substrate 602, logic die 604 and two via bars 608*a* and 608*b* are attached. Substrate 602 is sized accordingly. In the illustrated configuration, the two via bars 608*a* and 608*b* are on the same plane as logic die 604 on opposite lateral ends of logic die 604, such that logic die 604 is flanked by via bars 608*a-b*. In some implementations, via bars 608*a-b* are electrically connected to logic die 604 through metal connections which can be formed on a second surface, such as, a bottom surface of via bars 608*a-b* (or the first surface of substrate 602), for example. Two memory dies, for example, DRAM dies 606*a* and 606*b* are formed on first (or top) surfaces of the two via bars 608*a* and 608*b* respectively. DRAM dies 606*a* and 606*b* may both have leads 610*a* and 610*b* formed on their respective centers. DRAM dies 606*a* and 606*b* may be coupled to logic die 604 through via bars 608*a* and 608*b* (for example, by means of TGVs through the via bars 608*a-608b*). A portion of both DRAM dies 606*a* and 606*b* may extend over a first surface or top surface of logic die 604, but otherwise, both DRAM dies 606*a* and 606*b* are vertically staggered in their placement over logic die 604. In other words, the DRAM dies 606*a-b* are not vertically integrated or stacked over logic die 604 according to conventional 3D stacking, for example. Heat dissipation is possible over the areas of the first or top surface of logic die 604 which are not overlapped by DRAM dies 606*a-b*. Structure 600 provides an efficient manner of coupling two memory dies to a logic die using exemplary via bars, while providing short interconnect paths to both memory dies, maintaining a low foot print, and improving thermal management.

Figure 6B:
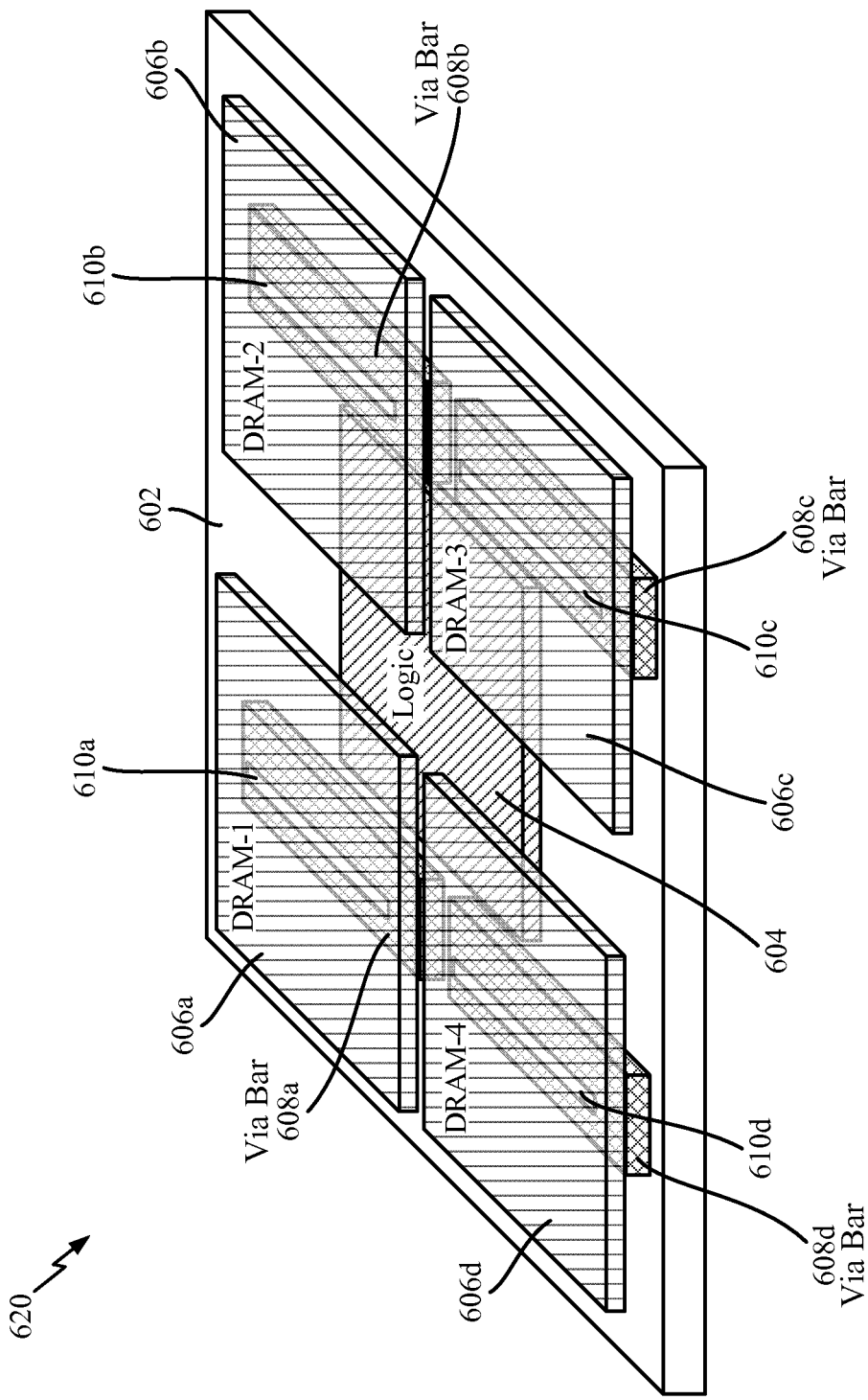

With reference to FIG. 6B, structure 620 with four memory dies coupled to a logic die, according to exemplary embodiments, is illustrated. Once again, omitting a detailed discussion of previously described similar components, structure 620 comprises substrate 602, sized large enough to accommodate logic die 604 and connections to four memory dies, DRAM dies 606*a-d*. DRAMs 606*a-d* may have leads 610*a-d* on their centers and configured to connect to logic die 604 through via bars 608*a-d* respectively. In this case, two via bars are placed end-on-end on either side of logic die 604, flanking logic die 604. DRAM dies 606*a-d* are vertically staggered to avoid a conventional 3D stacking arrangement with logic die 604, and may partially overlap a first or top surface of logic die 604. Structure 620 beneficially provides an efficient low foot print design to connect four memory dies to logic die 604, while maintaining low package height and improved thermal management.

Figure 6C:
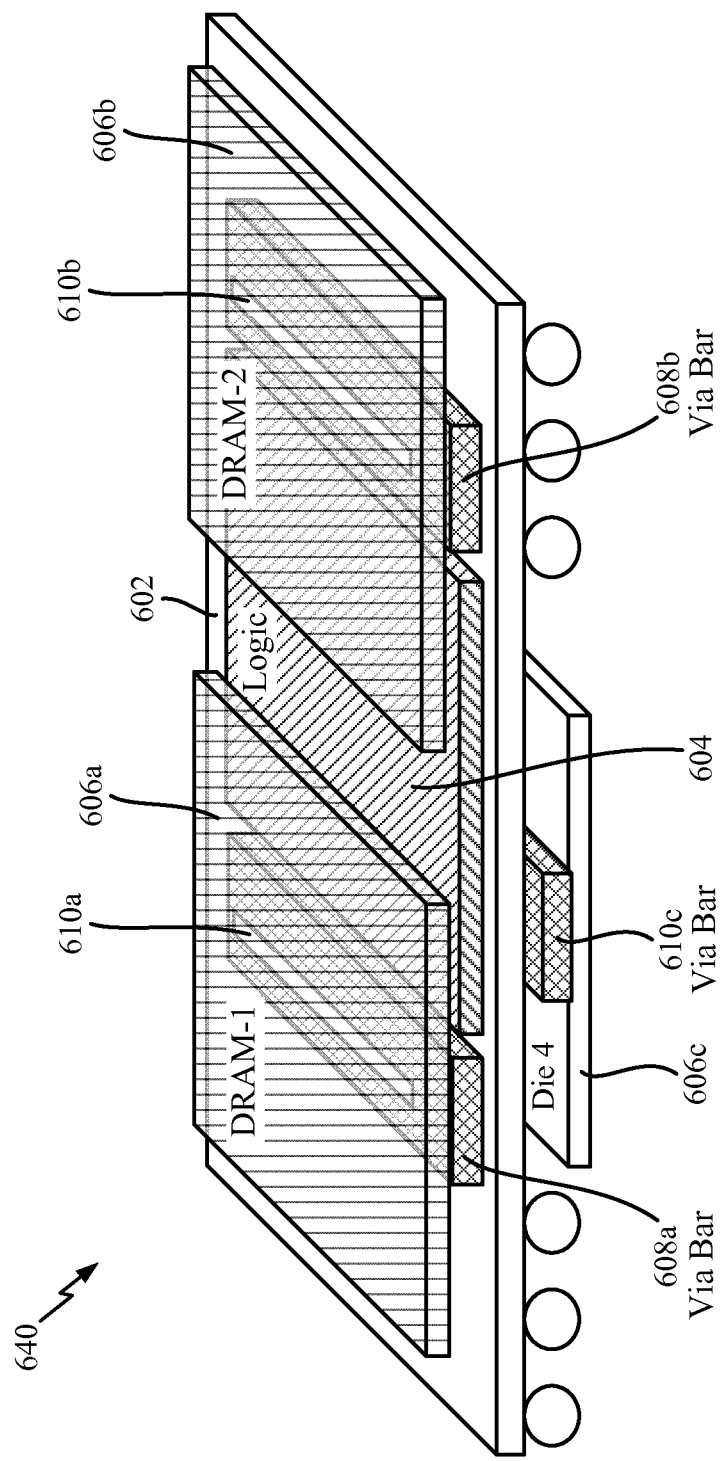

FIG. 6C illustrates structure 640, which is similar in many aspects to structure 600 of FIG. 6A. In addition to the components shown and described in structure 600, structure 640 includes yet another memory die 606*c*, attached to the second or bottom surface of substrate 602 through via bar 610*c*. In this case, TGVs may be formed through substrate 602 in order to connect via bar 610*c* to logic die 604. Structure 640 provides yet another alternative to maintain a low foot print (i.e., rather than add memory die 606*c* to the first or top surface of substrate 602), while also improving utilization of unused areas of the second surface or bottom surface of substrate 602.

Figure 6D:
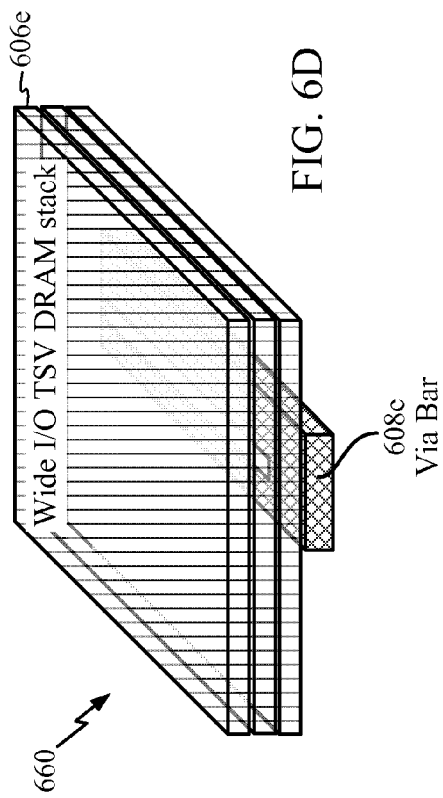
Figure 6E:
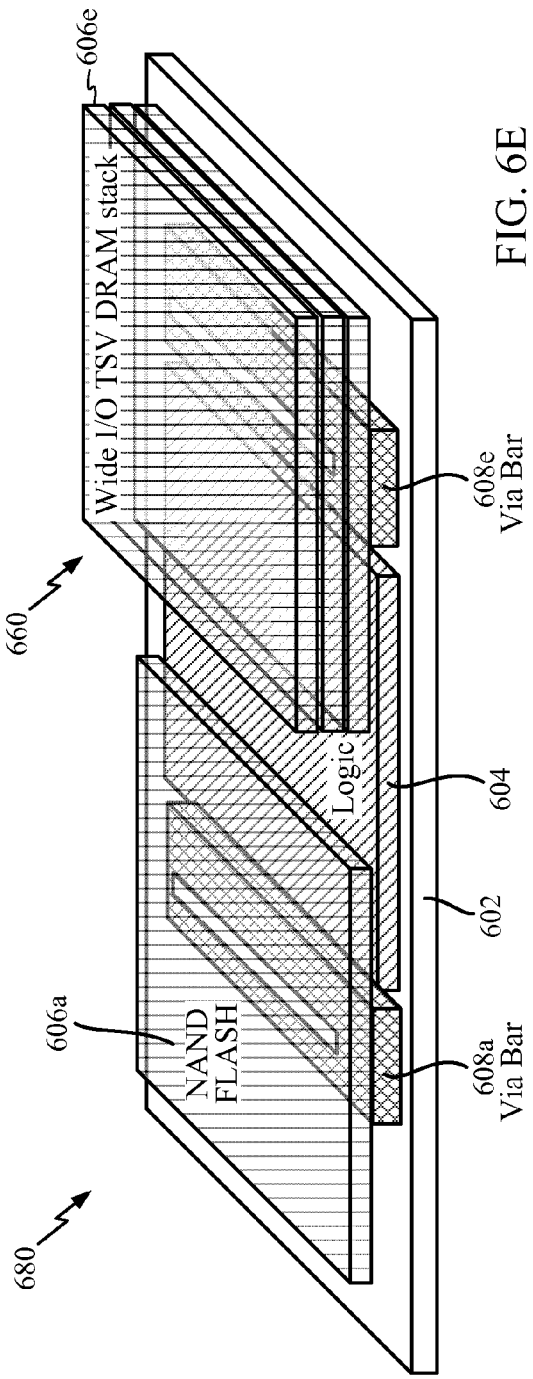

With reference to FIGS. 6D-E, structure 660 is illustrated in FIG. 6D, which may be employed in structure 680 of FIG. 6E. Structure 660 includes a stack of memory dies, such as, two or more wide I/O TSV DRAMs. The footprint of a memory package comprising a stack of memory dies can be reduced by including a memory die stack attached to the memory package substrate by flip-chip attachment rather than by wire bonds. Further, in some implementations, a stacked memory architecture including through-silicon vias (TSVs) can be employed to reduce the memory package footprint. For example, a PoP can include a wide I/O memory die. The three DRAMs illustrated in memory stack 606*e* may be connected to via bar 608*e* through TSVs (not shown).

However, in general, the fine pitch pads on wide I/O DRAM cannot be easily probed with full wafer contactor probe cards. As the probing is difficult, determining known good DRAM dies is typically a challenging task.

In exemplary implementations, on the other hand, probing at a coarse pitch using full wafer contractor probe cards is possible. As shown in FIGS. 6D-E, via bar 608*e* can be attached to the bottom of an individual DRAM die, a die stack, or a die on a wafer. In exemplary implementations, a plurality of DRAM dies on a DRAM wafer can each have an attached via bar such as via bar 608*e*. The attached via bars can serve multiple functions. According to a first functionality, prior to singulation, the attached via bars can serve as space transformers during testing of the DRAM wafer, by enabling full wafer contractor probing of the DRAM wafer at a coarse pitch. The testing can involve wafer probing and optical inspection operations. Based on the testing known good wide I/O TSV DRAM dies can be determined for packaging.

In a second functionality, during downstream processing and packaging of the DRAM dies, the attached via bars can be used for packaged separately as single packages or as PoP structures. For example, structure 660 can be packaged separately, and each wide I/O DRAM die, or memory stack 606*e*, can be directly tested using wafer level probes because of the fine pitch pads typically available for wide I/O DRAMs. Packages that do not pass the testing are identified and not used in a PoP. Thus, the glass via bars can be used to enable probing and determination of known good dies.

In FIG. 6E, structure 680 is similar to structure 600 of FIG. 6A, with differences such as, via bar 608*b* and DRAM die 606*b* of structure 600 being replaced by structure 660 of FIG. 6D. DRAM die 606*a* may also optionally be replaced by a NAND FLASH drive to meet certain requirements of specific applications. Logic die 604 can be electrically connected to all three wide I/O TSV DRAMs in memory stack 606*e* through via bar 608e. While this increases package height, the advantages of structure 660 discussed above can be incorporated in structure 680.

With reference now to FIGS. 7A-B, isometric schematic representations of exemplary glass via bar 708 are illustrated. The above-mentioned '925 Application, as well as, the 123236 Application include additional details pertaining to formation of exemplary glass via bar 708. The structures described with regard to glass via bar 708 can be applicable to glass via bars 508 and 608a-e discussed in exemplary embodiments of FIGS. 5-6 above.

In more detail, FIG. 7A shows glass via bar 708 including through-glass vias (TGVs) 702. The glass via bar 100 has a length L, a width W and a height H. (It should be noted that the geometry is not shown to scale with the height expanded for the purposes of illustration). In some aspects, the height H can be made to correspond to the height of a logic die, for example, logic die 504. TGVs 702 extend through glass via bar 708, providing conductive pathways between opposing faces. TGVs 702 and their and via openings can have any appropriate shape, and their sidewall contours can be linear or curved. Glass via bar 708 can include any number of through-glass vias placed or arrayed in any regular or irregular arrangement. In some implementations, glass via bar 708 may include partially filled or unfilled through-glass via holes.

With reference now to FIG. 7B, glass via bar 708 can also be provided with conductive routing structures or metal connections on one or more of its faces. In some implementations, glass via bar 708 is provided with one or more integrated passive components. An integrated passive component is a passive component provided on one or more of faces or embedded within glass via bar 708. For example, in addition to TGVs 702 that extend through glass via bar 708, passive components including capacitor 710 and resistor 706 can be formed on a first or top surface 712 of glass via bar 708. Plated conductive routing 704 can be formed on first or top surface 712, as well as a second surface such as a bottom surface of glass via bar 708 (not shown in this view). In some implementations, multiple TGVs 702 can be connected to form solenoid-type inductors, or circular or elongated torroid-type inductors. As shown in FIG. 7B, a portion of a solenoid inductor 714 is formed by connecting multiple TGVs 702 on first or top surface 712 and the second or bottom surface (not shown).

Figure 8:
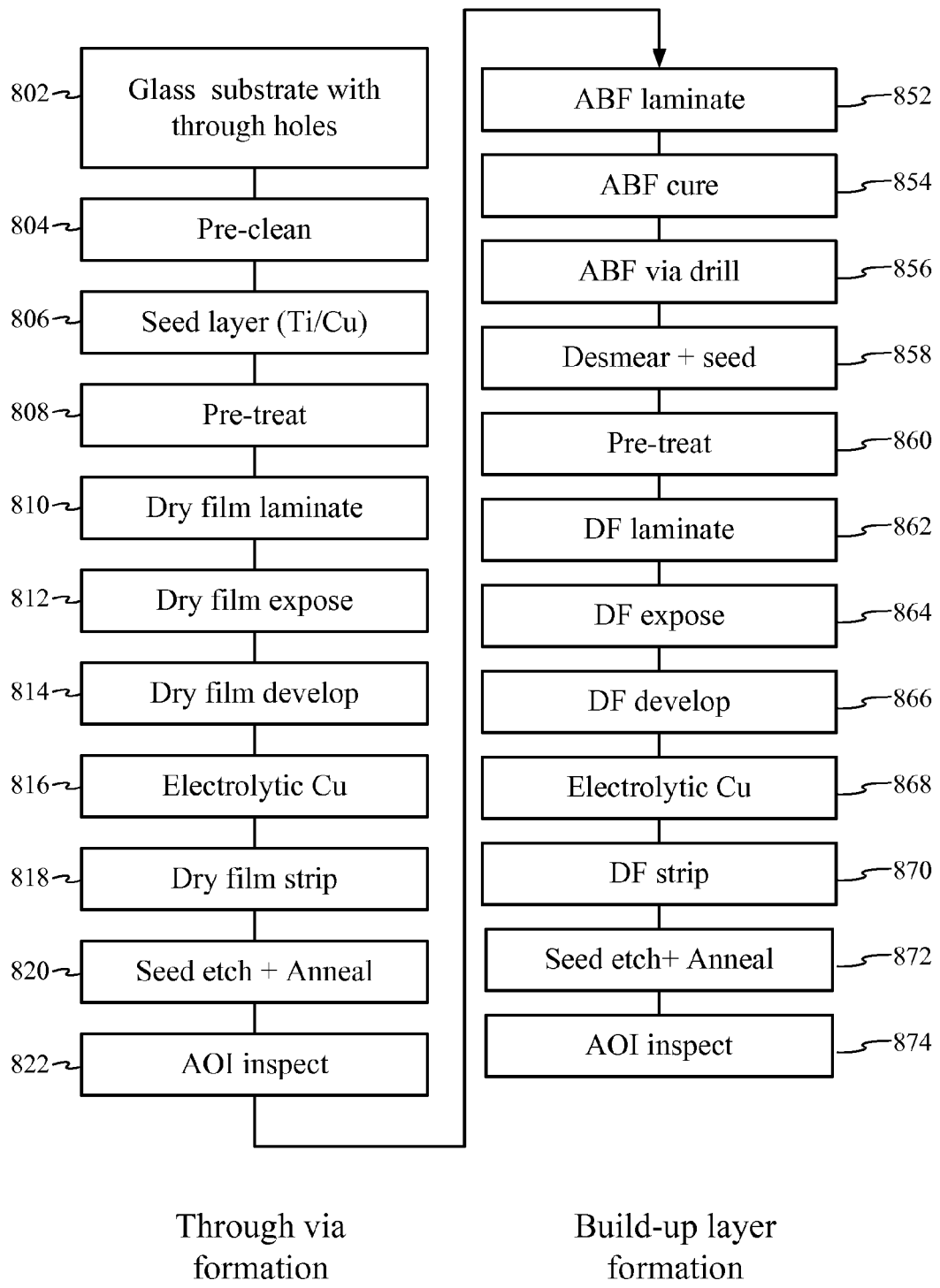
FIG. 8 is a flow chart of an exemplary method of forming a package structure with a via bar.

Referring now to FIG. 8, flow diagrams are illustrated for an exemplary process of forming via bars according to exemplary embodiments. Briefly, Blocks 802-822 relate to formation of through vias (e.g., TGVs) and a first metal layer in an exemplary via bar, followed by Blocks 852-874 pertaining to formation of one or more build-up layers. It will be understood that the process flow of FIG. 8 may be dependent on contact pads used for forming connections on the PCB that an exemplary structure is mounted on. For example, contact pads may have variable finishes which include a Copper (Cu) pillar with a Tin (Sn) cap (e.g., a microbump); a Cu pad with an organic surface finish; a Cu pad with a solder bump; a Cu pad with Nickel (Ni)/Palladium (Pd)/Gold (Au) finish; or a Cu pad with Ni/Pd/Au finish in addition to a solder.

Blocks 802-822 can generally pertain to forming a glass via bar (e.g., via bar 508) on a glass substrate and forming through-glass via (e.g., TGVs 702) holes in the glass via bar, for example, patterning and etching photo-patternable glass. In more detail, patterning the photo-patternable glass can include masking the glass to define the TGV holes and exposing the unmasked portions of the glass body to ultraviolet (UV) light and thermal annealing (Block 802). With reference to FIG. 8, this can further include pre-cleaning the glass substrate (Block 804); forming a seed layer on an interior surface of the TGV holes, for example, by a process such as, sputtering, PVD, CVD, ALD, or an electroless plating process (Block 806); pre-treating the photo-patternable glass, for example, with electromagnetic radiation and heat, which can result in chemical reactions that render the glass etchable with etchants such as hydrofluoric (HF) acid (Block 808); laminating the glass with a dry film (Block 810); exposing the dry film (Block 812); and developing the dry film (Block 814). Next, electrolytic Cu plating may be used for filling the TGV holes or for conformally plating the TGV holes with a conductive material such as Cu (Block 816). The dry film is then stripped (Block 818); the seed layer is etched, followed by a process of thermal annealing (Block 820); and the glass via bar can be tested at this stage, for example, using automated optical inspection (AOI) operations (Block 822).

The glass via bar can then be laminated, for example, with a Ajinomoto build-up film (ABF) laminate (Block 852). While a ABF laminate is illustrated, alternative films can be used for the build-up layer, such as Zeon insulating film, photodefinable polymer insulating dielectric such as polyimide, BCB cyclotene, etc. In the illustrated example, the ABF laminate is then cured (Block 854); and the ABF laminate layer is drilled for forming via hole openings (Block 856). The process then proceeds to desmearing and seed layer formation (Block 858). Following this, operations described above are performed again for the glass via bar, pertaining to pre-treatment (Block 860); dry film lamination (Block 862); dry film exposure (Block 864); and dry film development (Block 866); electrolytic Cu plating (Block 868); dry film stripping (Block 870); seed layer etching and annealing (Block 872); and AOI inspection (Block 874).

It will be understood that in the above-described processes of FIG. 8, the glass via bar can be fabricated on a wafer or a panel (e.g., eWLP processes according to the above-mentioned '925 Application). After the glass via bar fabrication is completed, electrical testing can be performed for determining electrically good glass via bars or known good dies. The wafer or panel is then diced to singulate individual via bars. Known good via bars are then used in the various packaging processes described above. Additionally, the process flow of FIG. 8 relates to a so-called "via-in-via" architecture. This process flow can be used to fabricate a glass via bar using either wafer, or panel processing used for organic substrate processing. In some embodiments, the above process flow can be modified from the via-in-via architecture to a "single via" architecture, wherein the metallization can be carried out directly on glass. Similarly, thin film processing can be added to the via bars to co-fabricate passives such as, resistors, inductors, and capacitors along with the electrically conducting via.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for forming a semiconductor device comprising a via bar. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A device comprising:
   a second surface of a logic die, a second surface of a first glass via bar, and a second surface of a second glass via bar coupled to a first surface of a substrate;
   a second surface of a first memory die coupled to a first surface of the first glass via bar, a second surface of a second memory die coupled to a first surface of the second glass via bar, a portion of the second surface of the first memory die and a portion of the second surface of the second memory die extending over the first surface of the logic die, such that the logic die and the first memory die are vertically staggered and the logic die and the second memory die are vertically staggered; and
   the first memory die electrically coupled to the logic die through the first glass via bar and the second memory die electrically coupled to the logic die through the second glass via bar, and the second memory die electrically coupled to the logic die through the second glass via bar, wherein one or more through-glass vias (TGVs) are formed within the first glass via bar and the second glass via bar.

2. The device of claim 1, wherein the first memory die and the second memory die each comprises a dynamic random access memory (DRAM) die.

3. The device of claim 2, wherein each DRAM die has wide input/output (I/O) interfaces.

4. The device of claim 3, wherein the each DRAM die is one of a plurality of DRAM dies formed on a DRAM wafer, and wherein each of the plurality of DRAM dies comprises one or more attached glass via bars.

5. The device of claim 4, wherein the one or more attached glass via bars are configured as space transformers to enable full wafer contractor probing of the DRAM wafer, at a coarse pitch, during testing of the DRAM wafer.

6. The device of claim 5, wherein one or more known good DRAM dies of the plurality of the DRAM dies formed on the DRAM wafer are determined based on the coarse pitch probing.

7. The device of claim 4, wherein each of the plurality of DRAM dies comprising the one or more attached glass via bars are configured for single package or package-on-package (PoP) structures.

8. The device of claim 1, further comprising one or more additional memory dies.

9. The device of claim 8, wherein the one or more additional memory dies are stacked on to a first surface of the first memory die and electrically connected to the first memory die through one or more through-silicon vias (TSVs).

10. The device of claim 8, wherein the one or more additional memory dies are electrically coupled to the logic die through one or more additional glass via bars.

11. The device of claim 1, further comprising a third memory die electrically coupled to the logic die through a third glass via bar, wherein the third glass via bar is attached to a second surface of the substrate.

12. The device of claim 1, wherein the first memory die comprises a lead on a center of the second surface of the first memory die for formation of an electrical contact with the first surface of the first via bar.

13. The device of claim 1, wherein passive components are embedded in the first glass via bar.

14. The device of claim 13, wherein the passive components comprise one or more of resistors, inductors, and capacitors.

15. The device of claim 13, wherein the passive components are configured to improve power delivery to the logic die.

16. The device of claim 1 encapsulated in a single package.

17. The device of claim 1, wherein the logic die and the substrate are encapsulated in a first package and the first memory die and the first via bar are encapsulated in a second package, wherein the first package and the second package are attached in a package-on-package (PoP) structure.

18. A device comprising:
   a substrate having a first surface and a second surface opposite the first surface;
   a logic die having a first surface and a second surface opposite the first surface;
   a glass via bar having a first surface and a second surface opposite the first surface, the glass via bar including one or more through-glass vias (TGVs) formed within the glass via bar to electrically connect the first surface of the glass via bar to the second surface of the glass via bar, wherein the second surface of the logic die and the second surface of the glass via bar are coupled to the first surface of the substrate; and
   a dynamic random access memory (DRAM) die having a first surface and a second surface opposite the first surface, wherein the second surface of the DRAM die is coupled to the first surface of the glass via bar, and wherein the second surface of the DRAM die extends over the first surface of the logic die such that the logic die and the DRAM die are vertically staggered, the DRAM die and the logic die being electrically coupled through the glass via bar, the DRAM die being one of a plurality of DRAM dies formed on a DRAM wafer, and wherein each of the plurality of DRAM dies includes one or more attached glass via bars configured as space transformers to enable full wafer contractor probing of the DRAM wafer, at a coarse pitch, during testing of the DRAM wafer.

19. The device of claim 18, wherein one or more known good DRAM dies of the plurality of the DRAM dies formed on the DRAM wafer are determined based on the coarse pitch probing.

20. The device of claim 18, wherein the DRAM die has wide input/output (I/O) interfaces.

21. The device of claim 18, further comprising:
a plurality of passive components embedded in the glass via bar.

22. A device comprising:
a substrate having a first surface and a second surface opposite the first surface;
a logic die having a first surface and a second surface opposite the first surface, wherein the logic die and the substrate are encapsulated in a first package;
a glass via bar having a first surface and a second surface opposite the first surface, the glass via bar including one or more through-glass vias (TGVs) formed within the glass via bar to electrically connect the first surface of the glass via bar to the second surface of the glass via bar, wherein the second surface of the logic die and the second surface of the glass via bar are coupled to the first surface of the substrate; and
a memory die having a first surface and a second surface opposite the first surface, wherein the second surface of the memory die is coupled to the first surface of the glass via bar, the second surface of the memory die extending over the first surface of the logic die such that the logic die and the memory die are vertically staggered, the memory die and the logic die being electrically coupled through the glass via bar, wherein the memory die and the glass via bar are encapsulated in a second package, the first package and the second package being attached in a package-on-package (PoP) structure.

23. The device of claim 22, wherein the memory die includes a dynamic random access memory (DRAM) die, wherein the DRAM die is one of a plurality of DRAM dies formed on a DRAM wafer, each of the plurality of DRAM dies including one or more attached glass via bars configured as space transformers to enable full wafer contractor probing of the DRAM wafer, at a coarse pitch, during testing of the DRAM wafer.

24. The device of claim 23, wherein one or more known good DRAM dies of the plurality of the DRAM dies formed on the DRAM wafer are determined based on the coarse pitch probing.

25. The device of claim 23, wherein the DRAM die has wide input/output (I/O) interfaces.

26. The device of claim 22, further comprising:
a plurality of passive components embedded in the glass via bar.

\* \* \* \* \*